United States Patent [19]

Silvian

[11] Patent Number: 4,972,438

[45] Date of Patent: Nov. 20, 1990

[54] SELF-OSCILLATING TRANSMITTER

[75] Inventor: Sergiu Silvian, La Crescenta, Calif.

[73] Assignee: Siemens-Pacesetter, Inc., Sylmar, Calif.

[21] Appl. No.: 391,078

[22] Filed: Aug. 8, 1989

[51] Int. Cl.⁵ .................. H03B 11/00; H03L 7/04
[52] U.S. Cl. ..................... 375/59; 331/149;
             331/166; 128/419 P; 128/419 PG
[58] Field of Search ............. 307/473; 331/166, 149;
             375/59, 68; 128/419 P, 419 PG

[56] References Cited

U.S. PATENT DOCUMENTS 3,720,883  3/1973  Hess et al. .................. 331/166
4,649,298  3/1987  Tuhy ........................... 307/473

*Primary Examiner*—Benedict V. Safourek
*Assistant Examiner*—Young T. Tse
*Attorney, Agent, or Firm*—Leslie S. Miller; Lisa P. Weinberg

[57] ABSTRACT

A device for use as a self-oscillating Class D transmitter is disclosed which uses feedback to maintain the oscillation at the resonant frequency of the device, thereby optimizing the efficiency of operation and overcoming the frequency mismatching inherent in previously known transmitters. The device uses a series LC combination which is driven by a comparator and a tri-state logic driver, with a feedback loop using a differentiator used to switch the polarity of the square wave generator. The system thus self-oscillates at the resonant frequency of the capacitor and inductor, even when the inductance of the inductor is varied by the inductor coming into close proximity to another inductor.

10 Claims, 1 Drawing Sheet

SELF-OSCILLATING TRANSMITTER

BACKGROUND OF THE INVENTION

Field of the Invention

The present invention relates generally to transmitters, and more particularly to a self-oscillating transmitter which uses feedback to maintain the oscillation at the resonant frequency of the load, thereby optimizing the efficiency of operation and overcoming the frequency mismatching inherent in previously known transmitters.

Of the various types of power amplifiers in common use, Class D power amplifiers offer a particularly high degree of efficiency, and are thus quite desirable in applications in which efficiency is an important feature. Such applications include battery powered devices in which power conservation is critical to an extended operational life without battery recharging or replacement. One example of such an application is in programming devices used to program cardiac pacemakers.

Such programming devices, or programmers, operate on batteries, and use a telemetry head which contains a coil to communicate with an implanted pacemaker having a coil therein. By using magnetic coupling between the external coil in the telemetry head and the internal coil in the pacemaker, information may be transmitted between the programmer and the pacemaker. Such information transmitted may include, for example, device identification information, biological data, current operational parameters of the device, technical information regarding proper operation of the device, battery charge condition, revised operational parameters (programming information) for the device, and verification of information transmitted between the implanted device and the external transceiver.

It will be appreciated by those skilled in the art that it is desirable to extend the operating life of batteries in the programmer as much as is possible. Accordingly, a Class D transmitter is a highly desirable type of amplifier for use in a programmer. A Class D transmitter is typically implemented using a pair of switches connected in series with a battery. By driving the switches with a driver at a selected frequency $f_0$ to alternately close the switches, and by taking a tap at the point between the two switches, a square wave may be obtained. The driving frequency $f_1$ is selected because it is the resonant frequency of the LC combination in the transmitter.

This square wave is supplied to one side of a capacitor, the other side of which is connected to one side of an inductor which is the coil used to transmit the information. The other side of the inductor is grounded, and thus the voltage across the inductor will be a sinusoidal wave. By operating the driver to produce the square wave, which is converted into the sine wave, a digital "one" is transmitted. Similarly, by not operating the driver so that no square wave will be generated, the sine wave will quickly decay, whereby a digital "zero" is transmitted.

This Class D power amplifier is highly efficient, since transistors are used as the switches. In theory, Class D amplifiers are 100 percent efficient, although in practice it requires some power to operate the transistor switches. Thus, Class D power amplifiers are ideal for use in the application mentioned above, as the transmitter used in a pacemaker programmer.

Unfortunately, while this situation is ideal in theory, in practice there is at least one significant problem encountered in operating a Class D transmitter of the design described above in a pacemaker programmer. When the coil in the telemetry head of the programmer is brought into proximity to the coil in the programmer, the inductance of each coil will be affected by the other coil. As the coils get closer, the inductance of the coil in the telemetry head will be reduced by the proximity of the coil in the pacemaker.

The effect of this reduction in the inductance of the coil in the telemetry head is that the resonant frequency of the LC combination will also be changed. As the inductance is reduced by the proximity of the coil in the pacemaker, the resonant frequency of the capacitor together with the inductor in the telemetry head will increase to a new frequency $f_1$, which is higher than the original resonant frequency $f_0$. Thus, the driver will attempt to forcibly drive the transmitter at a frequency which is not the true resonant frequency of the LC combination in the transmitter. This results in a smaller voltage across the inductor, which reduces the signal and the efficiency of the transmitted signal.

It is accordingly the primary objective of the present invention that it provide a Class D transmitter which is not susceptible to the frequency mismatch problem of existing Class D transmitters. The efficiency of the transmitter should be maximized by avoiding the frequency mismatch which is characteristic in the art, thereby preventing losses by driving the LC combination in the transmitter at a non-resonant frequency. Thus, in operation the frequency of the square wave oscillation must be identical to the resonant frequency of the LC combination in the transmitter.

It is thus a secondary objective of the present invention that it control the frequency that the square wave signal is generated at. In this manner, the operational frequency is controlled precisely at the resonant frequency of the LC combination in the transmitter. While meeting all of the above objectives and guidelines, it is essential that the transmitter of the present invention continue to operate as a Class D transmitter to maximize the efficiency thereof. It is also an objective that all of the aforesaid advantages and objectives be achieved without incurring any substantial relative disadvantage.

SUMMARY OF THE INVENTION

The disadvantages and limitations of the background art discussed above are overcome by the present invention. With this invention, a series LC combination is driven by a comparator and a tri-state logic driver, with a feedback loop using a differentiator used to switch the polarity of the square wave generator. The tri-state logic driver is a tri-state controller which has a high impedance output when the control input is high, and will invert the logic input when the control input is low.

The control input supplied to the logic control is either a zero voltage (low) or a positive voltage (high), with the control input also being supplied through a first capacitor to the inverting input of the comparator, which is also connected to ground through a resistor. Thus, when the control input is first brought low, a voltage pulse will be applied to the inverting input of the comparator to start the system. The output of the comparator is connected to be the logic input of the tri-state logic driver. A second capacitor is connected between the output of the tri-state logic driver and the inverting input of the differentiator.

The output of the tri-state logic driver is connected to one side of a main capacitor, the other side of which is connected to one side of an inductor which is the coil used to transmit. The other side of the inductor is grounded. The main capacitor and inductor form the LC combination of the transmitter, which will have a particular resonant frequency.

A feedback path originates at the connection between the main capacitor and the inductor, and is connected to the input of a differentiator having a gain K. The output of the differentiator is supplied to the non-inverting input of the comparator. Upon the application of a low control input, the output of the tri-state logic driver will be a square wave. This is due to the operation of the feedback loop, which causes the switching operation to periodically occur. The system is thus self-oscillating.

The voltage across the inductor when the LC combination is driven by a square wave will be a sinusoidal wave with a 90 degree phase lead, while the system is operating as a Class D transmitter. The feedback loop will introduce another 90 degree phase lead (derivative) to provide, together with the tri-state logic driver 32 inverter (which has a 180 degree shift), a 0 degree (or positive) feedback. This will keep the system in self-oscillation with the frequency of the square wave at the resonant frequency of the LC combination, maximizing efficiency of the system. Thus, the frequency used to drive the LC combination in the transmitter is always the same frequency as the resonant frequency of the LC combination. The system as thus described is both simple to construct, and highly efficient in operation as a Class D transmitter.

It may therefore be seen that the present invention teaches a Class D transmitter which is not susceptible to the frequency mismatch problem of existing Class D transmitters. The efficiency of the transmitter is maximized by avoiding the frequency mismatch which is a characteristic of the prior art, thereby preventing losses which occurred due to driving the LC combination in the transmitter at a non-resonant frequency. Thus, in operation the frequency of the square wave oscillation is precisely identical to the resonant frequency of the LC combination in the transmitter.

The transmitter of the present invention also controls the frequency at which the square wave signal is generated. In this manner, the operational frequency may be controlled precisely at the resonant frequency of the LC combination in the transmitter. While meeting all of the other objectives and guidelines described above, the transmitter of the present invention also continues to operate as a Class D transmitter, thereby maximizing the efficiency thereof. Finally, all of the aforesaid advantages and objectives are achieved without incurring any substantial relative disadvantage.

DESCRIPTION OF THE DRAWINGS

These and other advantages of the present invention are best understood with reference to the drawings, in which.

DETAILED DESCRIPTION OF THE PREFERRED EMBODIMENT

Figure 1:
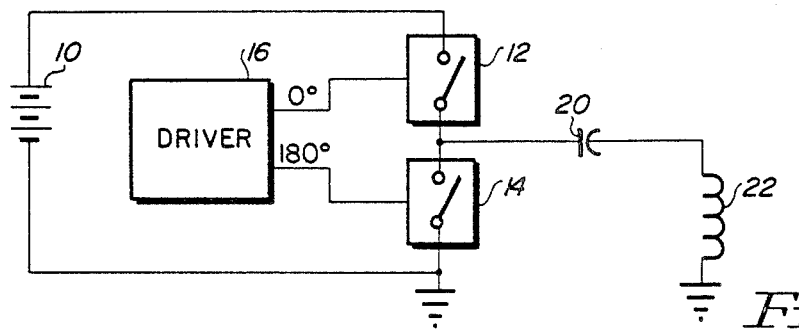
FIG. 1 is a functional schematic of a Class D transmitter as taught by the art.

Prior to a discussion of the preferred embodiment of the present invention, it is useful to consider a previously known Class D transmitter, which is illustrated in FIG. 1. The system of FIG. 1 is operated by switching voltage supplied by a battery 10, one side of which is grounded. Two switches 12 and 14 are connected in series with the battery 10. One side of the switch 12 is connected to the ungrounded side of the battery 10, with the other side of the switch 12 being connected to one side of the switch 14. The other side of the switch 14 is connected to the grounded side of the battery 10.

The switches 12 and 14 are both operated by a control driver 16 which drives the switches 12 and 14 at a selected frequency $f_0$ to alternately open and close them. Thus, for half of a cycle, the switch 12 will be closed and the switch 14 will be open, and for the other half of the cycle, the switch 12 will be open and the switch 14 will be closed. By taking a tap at the point between the two switches 12 and 14, which is the connection between the other side of the switch 12 and the one side of the switch 14, a square wave will be produced. The frequency of the square wave will be $f_0$.

The tap between the two switches 12 and 14 is connected to one side of a capacitor 20, the other side of which is connected to one side of an inductor 22. The other side of the inductor 22 is grounded. The resonant frequency of the combination of the capacitor 20 and the inductor 22 will be typically be close to $f_0$.

When a square wave is produced at the tap between the two switches 12 and 14, a sinusoidal wave will be produced across the inductor 22. The control driver 16 is operated to produce a square wave at the tap between the two switches 12 and 14 whenever a digital "one" is to be transmitted by the system of FIG. 1. The control driver 16 will not operate to close either of the two switches 12 and 14 when a digital "zero" is to be transmitted, and in this case the voltage across the inductor 22 will quickly decay to zero.

However, when the inductor 22 is brought into proximity to an inductor (not shown) used to receive the signals transmitted by the circuit of FIG. 1, the inductance of the inductor 22 will change. As the inductor 22 couples more and more with the other inductor (not shown), the inductance of the inductor 22 will be reduced, causing the resonant frequency of the capacitor 20 and the inductor 22 to be increased to a value $f_1$.

Since the value $f_1$ will vary considerably depending in the degree of coupling, it is apparent that the frequency $f_0$ which the capacitor 20 and the inductor 22 are driven at will not be equal to the resonant frequency $f_1$ of the capacitor 20 and 22. The control driver 16 will attempt to forcibly drive the transmitter at a frequency $f_0$ which is not the true resonant frequency $f_1$ of the capacitor 20 and the inductor 22. This results in a smaller voltage across the inductor 22, which reduces the efficiency of the transmitted signal. Thus, there is a degree of inefficiency which may substantially reduce the overall efficiency of the transmitter system.

Figure 2:
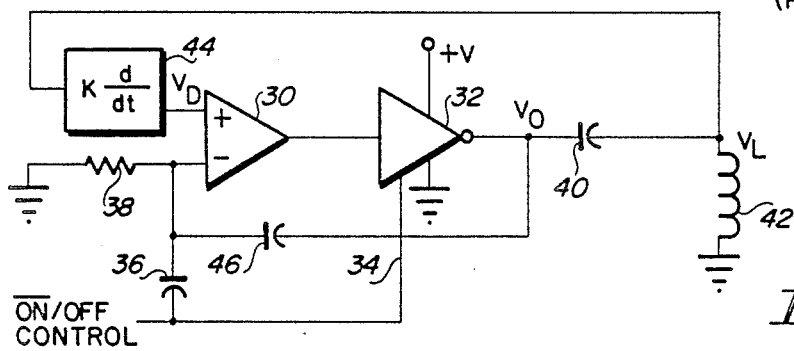
FIG. 2 is a functional schematic of the Class D transmitter of the present invention.

The system of the present invention, which eliminates the problem inherent in the Class D transmitter of FIG. 1, is shown in its preferred embodiment in FIG. 2. A comparator 30 having an inverting input and a non-inverting input is used as one of the principal components of the system of the present invention. The output of the comparator 30 is used as the logic input of a tri-state logic driver 32.

The tri-state logic driver 32 is driven by a control input on line 34. The tri-state logic driver 32 is a tri-state controller which has a high impedance output (open circuit) when the control input 34 is high. When the control input 34 is low, the tri-state logic driver 32 will provide an output which is the inverted version of the logic input supplied as the logic input to the tri-state logic driver 32 from the comparator 30.

The control input 34 supplied to the tri-state logic driver 32 in the preferred embodiment illustrated is either a zero voltage (low) or a positive voltage (high). Thus, the output of the tri-state driver 32 will be a high impedance output (open circuit) when a high voltage is applied as the control input 34, and the inverted version of the logic input to the tri-state logic driver 32 when a low voltage is applied as the control input 34.

The control input 34 is also supplied through a first capacitor 36 to the inverting input of the comparator 30. One side of the first capacitor 36 is connected to the control input 34, and the other side of the first capacitor 36 is connected to the inverting input of the comparator 30. A resistor 38 is connected on one side to the inverting input of the comparator 30, and on the other side to ground.

The output of the tri-state logic driver 32 is supplied to one side of a capacitor 40, the other side of which is connected to one side of an inductor 42. The other side of the inductor 42 is grounded. The voltage output of the tri-state logic driver 32 is labeled as $V_O$. The voltage across the inductor 42 is labeled as $V_L$. The resonant frequency of the combination of the capacitor 40 and the inductor 42 will be a frequency $f_1$, which will vary depending on the degree of coupling of the inductor 42 to another inductor (not shown).

There is a feedback connection which is taken from the connection between the other side of the capacitor 40 and the one side of the inductor 42. This feedback connection will feed back the voltage across the inductor 42 to a differentiator 44. The differentiator 44 will take the first differential of the voltage across the inductor 42, and multiply it by a gain factor of K. The output of the timing signals 44 is labeled as $V_D$. The output $V_D$ of the differentiator 44 is supplied as the non-inverting input to the comparator 30.

An analysis of the circuit shown in FIG. 2 will demonstrate that the voltage $V_L$ across the inductor 42 will be phase shifted by $-90$ degrees from the output $V_O$ of the tri-state logic driver 32 (the voltage $V_L$ across the inductor 42 will lead the voltage output $V_O$ from the tri-state logic driver 32 by 90 degrees). The differentiator 44 will also act as a $-90$ degree phase shifter (the voltage output $V_D$ from the differentiator 44 will lead the voltage $V_L$ across the inductor 42 by 90 degrees). Thus, the voltage output $V_D$ from the differentiator 44 will lead the voltage output $V_O$ from the tri-state logic driver 32 by 180 degrees.

Thus, as the input to the non-inverting input of the comparator 30 is going up, the output $V_O$ from the tri-state logic driver 32 will be going down, and vice versa. A second capacitor 46 is connected on one side to the output of the tri-state logic driver 32, and on the other side to the inverting input to the comparator 30. This second capacitor 46 is thus used to speed up the transition between outputs of the comparator 30, which drives the output of the tri-state logic driver 32 when the control input 34 is low.

Figure 4:
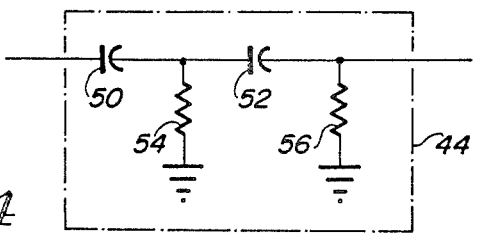
FIG. 4 is an example of a circuit which may be used as the differentiator in the circuit of FIG. 2.

One possible circuit for the differentiator 44 is illustrated in FIG. 4. A capacitor 50 has one side thereof used as the input to the differentiator 44, with the other side of the capacitor 50 being connected to one side of a capacitor 52. The other side of the capacitor 52 is the output of the differentiator 44. A resistor 54 is connected on one side to the other side of the capacitor 50 and the one side of the capacitor 52. The other side of the resistor 54 is connected to ground. A resistor 56 is connected on one side to the other side of the capacitor 52. The other side of the resistor 56 is connected to ground.

Figure 3:
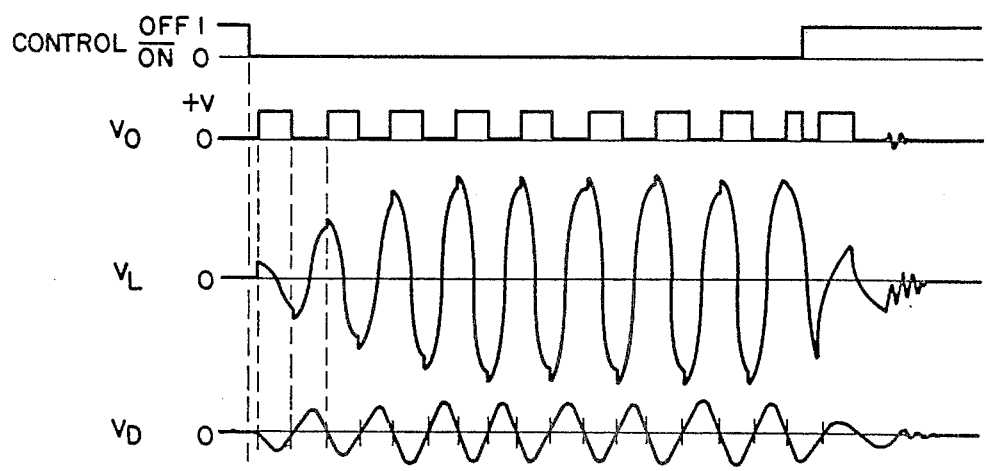
FIG. 3 is a series of is a diagram showing the control and output signals generated and transmitted by the transmitter shown in FIG. 2.

A brief description of the operation of the circuit of FIG. 2 may now be given, in conjunction with the timing diagrams of FIG. 3. At the outset, assume that the control input 34 is high, the output of the tri-state logic driver 32 is high impedance (open circuit), and the voltage $V_O$ is anywhere between $+V$ and ground. Thus, at the start time the control input 34 is brought from high to low.

The inverting input to the comparator 30 will receive a short negative pulse from the first capacitor 36. The output of the comparator 30 will be high, causing a low output $V_O$ from the tri-state logic driver 32. This low output is supplied through the capacitor 40 and the differentiator 44 to the non-inverting input of the comparator 30. The gain K of the differentiator 44 is selected so that the net differential input to the comparator 30 (the inverting input minus the non-inverting input) is a positive pulse of short duration.

The comparator 30 will switch output states when the output $V_D$ from the differentiator 44 crosses zero. Typically, the gain K has a value less than one, although since the comparator 30 will switch state when $V_D$ crosses zero, the gain K of the differentiator 44 is not critical. Thus, it is apparent that the circuit shown in FIG. 2 will self-oscillate, once it has been started by the first capacitor 36.

It may thus be perceived that the frequency of oscillation of the square wave output $V_O$ from the tri-state logic driver 32 will be at the harmonic frequency $f_1$ of the capacitor 40 and the inductor 42. This will be true even when the value of the inductance of the inductor 42 changes due to the inductor 42 being in proximity to another inductor (not shown), changing the harmonic frequency of the capacitor 40 and the inductor 42. Thus, the capacitor 40 and the inductor 42 are never force driven at a frequency other than the harmonic frequency.

When the control input 34 returns to a high value, the tri-state logic driver 32 no longer provides a square wave output. Rather, the output of the tri-state logic driver 32 is high impedance (open circuit). At this point, the voltage $V_L$ across the inductor 42 will quickly decay to zero.

It may therefore be appreciated from the above detailed description of the preferred embodiment of the present invention that it teaches a Class D transmitter which is not susceptible to the frequency mismatch problem of existing Class D transmitters. The efficiency of the transmitter is maximized by avoiding the frequency mismatch which is a characteristic of the prior art, thereby preventing losses which occurred due to driving the LC combination in the transmitter at a non-resonant frequency. Thus, in operation the frequency of the square wave oscillation is precisely identical to the resonant frequency of the LC combination in the transmitter.

The transmitter of the present invention also controls the frequency at which the square wave signal is generated. In this manner, the operational frequency may be controlled precisely at the resonant frequency of the LC combination in the transmitter. While meeting all of the other objectives and guidelines described above, the transmitter of the present invention also continues to operate as a Class D transmitter, thereby maximizing the efficiency thereof. Finally, all of the aforesaid advantages and objectives are achieved without incurring any substantial relative disadvantage.

Although an exemplary embodiment of the present invention has been shown and described, it will be apparent to those having ordinary skill in the art that a number of changes, modifications, or alterations to the invention as described herein may be made, none of which depart from the spirit of the present invention. All such changes, modifications, and alterations should therefore be seen as within the scope of the present invention.

What is claimed is:

1. A transmitter for transmitting a sequence of digital binary signals, comprising:
    a comparator having an inverting input and a non-inverting input, said comparator also having an output;
    a tri-state logic driver having a logic input and a control input, said tri-state logic driver also having an output, said logic input for said tri-state logic driver being said output of said comparator, said output of said tri-state logic driver having a high impedance when said control input has a first logic value, said output of said tri-state logic driver supplying the inverted value of said logic input of said tri-state logic driver as said output of said tri-state logic driver when said control input has a second logic value;
    a capacitor having a first terminal and a second terminal, said first terminal of said capacitor being connected to said output of said tri-state logic driver;
    an inductor having a first terminal and a second terminal, said first terminal of said inductor being connected to said second terminal of said capacitor, said second terminal of said inductor being grounded;
    a differentiator having an input and an output, said input of said differentiator being connected to said first terminal of said inductor and said second terminal of said capacitor, said output of said differentiator being connected to said non-inverting input of said comparator; and
    means for driving said transmitter, said driving means providing said first logic value as said control input to said tri-state logic driver when a first digital binary signal is to be sent, said driving means providing said second logic value as said control input to said tri-state logic driver when a second digital binary signal is to be sent, said driving means also sending a negative pulse to said inverting input of said comparator when said second digital binary signal is to be sent.

2. A transmitter as defined in claim 1, wherein said differentiator has a gain of less than one.

3. A transmitter as defined in claim 1, wherein said first digital binary signal is a digital one and said second digital binary signal is a digital zero.

4. A transmitter as defined in claim 1, wherein said first digital binary signal is a digital zero and said second digital binary signal is a digital one.

5. A transmitter as defined in claim 1, wherein said first logic value is a logic one signal and said second logic value is a logic zero signal, said first and second logic values being supplied to said tri-state logic driver by a control input line.

6. A transmitter as defined in claim 5, wherein said driving means comprises:
    a first capacitor having a first terminal and a second terminal, said first terminal of said first capacitor being connected to said control input line, said second terminal of said first capacitor being connected to said inverting input of said comparator; and
    a resistor having a first terminal and a second terminal, said first terminal of said resistor being connected to said inverting input of said comparator, said second terminal of said resistor being connected to ground.

7. A transmitter as defined in claim 6, wherein said driving means additionally comprises:
    a second capacitor having a first terminal and a second terminal, said first terminal of said second capacitor being connected to said output of said tri-state logic driver, said second terminal of said second capacitor being connected to said inverting input of said comparator 8. A transmitter for transmitting a sequence of digital binary signals, comprising:
    a comparator having an inverting input and a non-inverting input, said comparator also having an output;
    a tri-state logic driver having a logic input and a control input, said tri-state logic driver also having an output, said logic input for said tri-state logic driver being said output of said comparator, said output of said tri-state logic driver having a high impedance when said control input is a logic one, said output of said tri-state logic driver supplying the inverted value of said logic input of said tri-state logic driver as said output of said tri-state logic driver when said control input is a logic zero;
    a capacitor having a first terminal and a second terminal, said first terminal of said capacitor being connected to said output of said tri-state logic driver;
    an inductor having a first terminal and a second terminal, said first terminal of said inductor being connected to said second terminal of said capacitor, said second terminal of said inductor being grounded;
    a differentiator having an input and an output, said input of said differentiator being connected to said first terminal of said inductor and said second terminal of said capacitor, said output of said differentiator being connected to said non-inverting input of said comparator;
    a control input line connected to said control input of said tri-state logic driver;
    a first capacitor having a first terminal and a second terminal, said first terminal of said first capacitor being connected to said control input line, said second terminal of said first capacitor being connected to said inverting input of said comparator;
    a resistor having a first terminal and a second terminal, said first terminal of said resistor being connected to said inverting input of said comparator, said second terminal of said resistor being connected to ground; and a second capacitor having a first terminal and a second terminal, said first terminal of said second capacitor being connected to said output of said tri-state logic driver, said second terminal of said second capacitor being connected to said inverting input of said comparator.

9. A transmitter for transmitting a sequence of digital binary signals, comprising:

a comparator having an inverting input and a non-inverting input, said comparator also having an output;

a tri-state logic driver having a logic input and a control input, said tri-state logic driver also having an output, said logic input for said tri-state logic driver being said output of said comparator, said output of said tri-state logic driver having a high impedance when said control input has a first logic value, said output of said tri-state logic driver supplying the inverted value of said logic input of said tri-state logic driver as said output of said tri-state logic driver when said control input has a second logic value;

a capacitor having a first terminal and a second terminal, said first terminal of said capacitor being connected to said output of said tri-state logic driver;

an inductor having a first terminal and a second terminal, said first terminal of said inductor being connected to said second terminal of said capacitor, said second terminal of said inductor being grounded; and a differentiator having an input and an output, said input of said differentiator being connected to said first terminal of said inductor and said second terminal of said capacitor, said output of said differentiator being connected to said non-inverting input of said comparator.

10. A method of transmitting a sequence of digital binary signals, comprising:

providing an output from a tri-state logic driver to a series capacitor-inductor circuit, said series capacitor-inductor circuit comprising:

a capacitor having a first terminal and a second terminal, said first terminal of said capacitor being connected to said output of said tri-state logic driver; and an inductor having a first terminal and a second terminal, said first terminal of said inductor being connected to said second terminal of said capacitor, said second terminal of said inductor being grounded, said tri-state logic driver also having a logic input and a control input, said output of said tri-state logic driver having a high impedance when said control input has a first logic value, said output of said tri-state logic driver supplying the inverted value of said logic input of said tri-state logic driver as said output of said tri-state logic driver when said control input has a second logic value;

driving said logic input of said tri-state logic driver with an output from a comparator, said comparator also having an inverting input and a non-inverting input;

driving said non-inverting input of said comparator with an output from a differentiator, said differentiator also having an input connected to said first terminal of said inductor and said second terminal of said capacitor; and driving said transmitter with a driving means, said driving means providing said first logic value as said control input to said tri-state logic driver when a first digital binary signal is to be sent, said driving means providing said second logic value as said control input to said tri-state logic driver when a second digital binary signal is to be sent, said driving means also sending a negative pulse to said inverting input of said comparator when said second digital binary signal is to be sent.

* * * * *